(12) United States Patent
Hwang et al.

(10) Patent No.: US 10,971,376 B2
(45) Date of Patent: Apr. 6, 2021

(54) PRINTED CIRCUIT BOARD WITH PROTECTIVE MEMBER AND METHOD OF MANUFACTURING SEMICONDUCTOR PACKAGE HAVING THE SAME

(71) Applicant: SAMSUNG ELECTRONICS CO., LTD., Suwon-si (KR)

(72) Inventors: Jae Seon Hwang, Hwaseong-si (KR); Hyeong Gi Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/044,718

(22) Filed: Jul. 25, 2018

(65) Prior Publication Data

US 2019/0221444 A1 Jul. 18, 2019

(30) Foreign Application Priority Data

Jan. 15, 2018 (KR) .................. 10-2018-0004994

(51) Int. Cl.
| | |
|---|---|
| *H01L 21/48* | (2006.01) |
| *H01L 21/683* | (2006.01) |
| *H01L 21/56* | (2006.01) |
| *H01L 23/498* | (2006.01) |
| *H01L 23/31* | (2006.01) |
| *H01L 23/00* | (2006.01) |

(52) U.S. Cl.
CPC ........ *H01L 21/486* (2013.01); *H01L 21/4857* (2013.01); *H01L 21/56* (2013.01); *H01L 21/6835* (2013.01); *H01L 23/3114* (2013.01); *H01L 23/49816* (2013.01); *H01L 23/49822* (2013.01); *H01L 23/49827* (2013.01); *H01L 23/3121* (2013.01); *H01L 23/562* (2013.01); *H01L 2221/68304* (2013.01)

(58) Field of Classification Search
None
See application file for complete search history.

(56) References Cited

U.S. PATENT DOCUMENTS

| | | | |
|---|---|---|---|
| 8,008,130 | B2 | 8/2011 | Honda |
| 8,410,375 | B2 | 4/2013 | Matsushita et al. |
| 9,287,203 | B2 | 3/2016 | Lin et al. |
| 2005/0090043 | A1* | 4/2005 | Tsai ............... H01L 23/3128 438/108 |
| 2010/0062621 | A1* | 3/2010 | Bruennert ......... H05K 1/141 439/68 |

(Continued)

FOREIGN PATENT DOCUMENTS

| | | |
|---|---|---|
| JP | 4599891 | 10/2010 |
| KR | 10-2009-0082029 | 7/2009 |

(Continued)

*Primary Examiner* — Jay C Chang
(74) *Attorney, Agent, or Firm* — F. Chau & Associates, LLC

(57) ABSTRACT

A method of manufacturing a semiconductor package includes providing a substrate main body to which external connection terminals are attached, attaching a protective member to the substrate main body to cover the external connection terminals, mounting a semiconductor chip on a surface of the substrate main body that is opposite from the protective member, and removing the protective member from the substrate main body.

13 Claims, 8 Drawing Sheets

(56) References Cited

U.S. PATENT DOCUMENTS

| | | | | |
|---|---|---|---|---|
| 2010/0244233 | A1* | 9/2010 | Kim | H01L 21/561 |
| | | | | 257/693 |
| 2014/0353827 | A1 | 12/2014 | Liu et al. | |
| 2015/0325465 | A1* | 11/2015 | Iwata | B32B 38/1858 |
| | | | | 156/703 |
| 2015/0364432 | A1* | 12/2015 | Chung | H01L 21/4803 |
| | | | | 257/621 |
| 2016/0172244 | A1* | 6/2016 | Tanaka | H01L 21/78 |
| | | | | 438/125 |
| 2017/0164463 | A1 | 6/2017 | Hatch et al. | |
| 2017/0338173 | A1* | 11/2017 | Chen | H01L 23/3114 |
| 2017/0374737 | A1* | 12/2017 | Jeong | B32B 15/08 |

FOREIGN PATENT DOCUMENTS

| | | |
|---|---|---|
| KR | 10-1508841 | 4/2015 |
| KR | 10-1588312 | 1/2016 |

\* cited by examiner

PRINTED CIRCUIT BOARD WITH PROTECTIVE MEMBER AND METHOD OF MANUFACTURING SEMICONDUCTOR PACKAGE HAVING THE SAME

CROSS-REFERENCE TO RELATED APPLICATION

This U.S. non-provisional patent application claims priority under 35 U.S.C. § 119 from, and the benefit of, Korean Patent Application No. 10-2018-0004994, filed on Jan. 15, 2018 in the Korean Intellectual Property Office (KIPO), the contents of which are herein incorporated by reference in their entirety.

BACKGROUND

1. Technical Field

Embodiments of the present inventive concept are directed to a printed circuit board with a protective member and a method of manufacturing a semiconductor package having the same.

2. Discussion of the Related Art

As electronic devices such as portable terminals have become smaller and have higher performance, semiconductor packages need to be lighter, thinner, and simpler. Thus, a coreless substrate technique for making a printed circuit board thinner has been introduced. For example, a technique for a printed circuit board having a metal wire buried in an insulating layer, such as an embedded trace substrate (ETS), has been suggested. However, an ETS PCB is thin and does not include a core layer, and is thus vulnerable to physical and thermal changes. In particular, a substrate is likely to be polluted by foreign substances, damaged, or warped during a molding process or a marking process.

To overcome these substrate defects, a technique has been proposed that modifies the printed circuit board structure or adds a process. However, this technique increases the thickness of the PCB and complicates the process, which can also cause substrate or semiconductor package defects and increase the manufacturing costs.

SUMMARY

Embodiments of the present inventive concept are directed to providing a printed circuit board than can suppress warping thereof to decrease a defect rate, and a semiconductor package including the same.

Embodiments of the present inventive concept are also directed to providing a method of manufacturing a printed circuit board that includes a protective member and can prevent damage to a substrate and increase productivity, and a semiconductor package including the same.

A method of manufacturing a semiconductor package according to an exemplary embodiment of the present inventive concept includes providing a substrate main body to which external connection terminals are attached, attaching a protective member to the substrate main body to cover the external connection terminals, mounting a semiconductor chip on a surface of the substrate main body that is opposite from the protective member, and removing the protective member from the substrate main body.

A method of manufacturing a semiconductor package according to an exemplary embodiment of the present inventive concept includes providing a substrate main body to which external connection terminals are attached, attaching a protective member to a first surface of the substrate main body to control warping of the substrate main body, mounting a semiconductor chip on a second surface of the substrate main body opposite from the first surface, and forming an encapsulant that covers the second surface of the substrate main body and the semiconductor chip.

A printed circuit board according to an exemplary embodiment of the present inventive concept includes a substrate main body that includes alternately stacked insulating layers and conductive layers, and external connection terminals and a protective member disposed on a first surface of the substrate main body. A first conductive pad and a second conductive pad are respectively provided on the first surface and a second surface of the substrate main body, the external connection terminals are disposed on a bottom surface of the first conductive pad, and the protective member covers the external connection terminals.

DETAILED DESCRIPTION OF EXEMPLARY EMBODIMENTS

Figure 1:
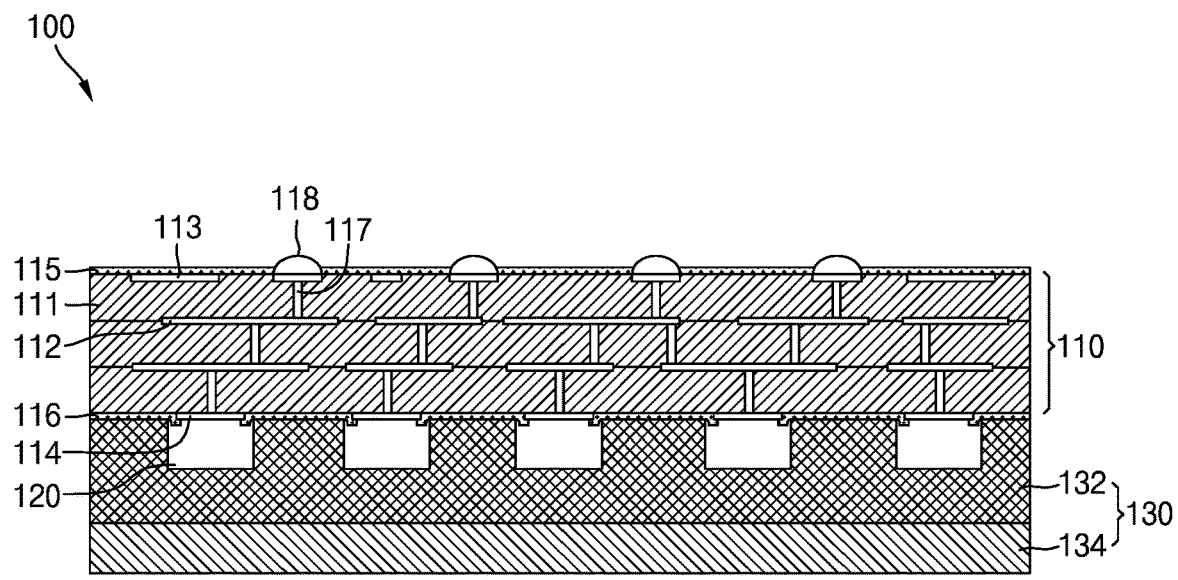
FIG. 1 is a cross-sectional view of a printed circuit board according to an exemplary embodiment of the present inventive concept.

FIG. 1 is a cross-sectional view of a printed circuit board 100 according to an exemplary embodiment of the present inventive concept.

Referring to FIG. 1, according to an exemplary embodiment, the printed circuit board 100 includes a substrate main body 110, external connection terminals 120, and a protective member 130. The external connection terminals 120 are formed on a bottom surface of the substrate main body 110. The protective member 130 is formed on the bottom surface of the substrate main body 110 and covers the external connection terminals 120. In FIG. 1, the bottom surface of the substrate main body 110 can be understood to mean a lower side of the substrate main body 110, and can be referred to as a first surface. A top surface of the substrate main body 110 can be understood to mean a side of the substrate main body 110 opposite the bottom surface, and can be referred to as a second surface.

According to an exemplary embodiment, the substrate main body 110 includes insulating layers 111, conductive layers 112, conductive pads 113 and 114, a top-surface solder mask 115, and a bottom-surface solder mask 116. The substrate main body 110 further includes conductive vias 117 and solder bumps 118. The substrate main body 110 is a thin film. The substrate main body 110 is a careless substrate having no core layer. For example, the substrate main body 110 can be an embedded trace substrate (ETS) in which a trace is buried in the insulating layers 111.

According to an exemplary embodiment, the substrate main body 110 is formed by alternately stacking the insulating layers 111 and the conductive layers 112. The conductive pads 113 are formed on the top surface of the substrate main body 110. The conductive pads 114 are formed on the bottom surface of the substrate main body 110, and are located in empty spaces in the bottom-surface solder mask 116 to be level with the bottom-surface solder mask 116. The top-surface solder mask 115 is formed to cover the top surface of the substrate main body 110. The bottom-surface solder mask 116 is formed to cover the bottom surface of the substrate main body 110. The substrate main body 110 has a thickness of 160 μm or less.

According to an exemplary embodiment, the insulating layers 111 have a two-layer or three-layer stacked structure. The conductive layers 112 are formed between adjacent insulating layers 111. The insulating layers 111 may include a phenolic resin, an epoxy resin, or a carbon fiber reinforced polymer (prepreg).

According to an exemplary embodiment, the conductive layers 112 are formed between adjacent insulating layers 111 and have two or more layers. The conductive layers 112 form a circuit pattern. The circuit pattern is formed by etching a part of a conductive plate. The conductive layers 112 include copper (Cu).

According to an exemplary embodiment, the conductive pads 113 are formed on the top surface of the substrate main body 110. The conductive pads 113 are embedded in the insulating layer 111 such that top surfaces of the conductive pads 113 and a top surface of the insulating layer 111 are at the same level. The conductive pads 114 are formed on the bottom surface of the substrate main body 110. The conductive pads 114 are formed of copper (Cu) or aluminum (Al). In one embodiment, the conductive pads 114 are plated with a metal layer. The metal layer contains nickel (Ni), tin (Sn), gold (Au), or lead (Pb).

According to an exemplary embodiment, the top-surface solder mask 115 is formed on the top surface of the substrate main body 110. The top-surface solder mask 115 covers top surfaces of the insulating layers 111. The top-surface solder mask 115 is etched using a photoresist pattern to expose some of the conductive pads 113 embedded in the insulating layers 111.

According to an exemplary embodiment, the top-surface solder mask 115 is formed by screen printing. For example, the top-surface solder mask 115 can be formed by applying an infrared (IR) ink or an ultraviolet (UV) ink on the top surface of the substrate main body 110 and drying and hardening the applied IR or UV ink by applying heat or UV light thereto. Alternatively, the top-surface solder mask 115 may be formed by photo solder resist printing. For example, a photo solder resist can be applied using a PSR ink or attached thereto by laminating. The top-surface solder mask 115 is formed by hardening the photo solder resist by exposing and developing the photo solder resist and drying it with UV light.

According to an exemplary embodiment, the bottom-surface solder mask 116 is formed on the bottom surface of the substrate main body 110. The bottom-surface solder mask 116 covers bottom surfaces of the insulating layers 111. The bottom-surface solder mask 116 is formed by screen printing or photo solder resist printing.

According to an exemplary embodiment, the conductive vias 117 are formed in the insulating layers 111. The conductive vias 117 can be formed by forming via holes in the insulating layers 111 using a CNC drill or a $CO_2$ or YAG laser drill and filling the via holes with a conductive material.

According to an exemplary embodiment, the conductive vias 117 electrically connect the conductive pads 113 and 114 on different adjacent layers. The conductive vias 117 electrically connect the conductive pads 113 on the top surface of the substrate main body 110 and the conductive layers 112. The conductive via 117 electrically connect the conductive pads 114 on the bottom surface of the substrate main body 110 and the conductive layers 112.

According to an exemplary embodiment, the solder bumps 118 are formed on the conductive pads 113 exposed by the partially etched top-surface solder masks 115. The solder bumps 118 contain tin (Sn) or silver (Ag). The solder bumps 118 also contain copper (Cu), palladium (Pd), bismuth (Bi), or antimony (Sb). A seed layer is formed below the solder bumps 118. Alternatively, the solder bumps 118 are formed on copper (Cu) pillars. In one embodiment, the solder bumps 118 are not formed on the printed circuit board 100.

According to an exemplary embodiment, a semiconductor device is mounted on the solder bumps 118. The solder bumps 118 electrically connect the conductive pads 113 and the semiconductor device.

According to an exemplary embodiment, the external connection terminals 120 are formed on the bottom surface of the substrate main body 110. The external connection terminals 120 are formed on bottom surfaces of the conductive pads 114. The external connection terminals 120 are solder. The external connection terminals 120 are formed and mounted on the conductive pads 114 before the semiconductor device is mounted on the solder bumps 118. The external connection terminals 120 are processed by a reflow process after the semiconductor device is mounted and an encapsulant 150 (see FIGS. 10-12) is formed on the printed circuit board 100.

According to an exemplary embodiment, the external connection terminals 120 are formed by electroplating or a similar process after a photoresist pattern is formed on the bottom surface of the substrate main body 110. The external connection terminals 120 contain tin (Sn), lead (Pb), silver (Ag), or bismuth (Bi).

According to an exemplary embodiment, the protective member 130 has a heterojunction structure in which different layers are stacked. The protective member 130 includes an adhesive layer 132 and a protective film 134. The protective member 130 is formed by being laminated on the bottom surface of the substrate main body 110. The protective member 130 covers the bottom-surface solder mask 116 and the external connection terminals 120. The protective member 130 is attached to the substrate main body 110 after the external connection terminals 120 are mounted on the substrate main body 110 and before the semiconductor device is mounted on the substrate main body 110.

According to an exemplary embodiment, the protective member 130 is attached to the bottom surface of the substrate main body 110 to prevent damage to the substrate main body 110 during a semiconductor package process. For example, the protective member 130 can reinforce the substrate main body 110 to prevent the substrate main body 110 from being crushed or bent. Furthermore, the protective member 130 can protect the substrate main body 110 from being partially torn or cut. The protective member 130 can prevent the substrate main body 110 from sagging and from being separated from a magazine during the semiconductor package process.

According to an exemplary embodiment, the adhesive layer 132 is formed on the bottom surface of the substrate main body 110 between the substrate main body 110 and the protective film 134. The adhesive layer 132 covers the bottom-surface solder mask 116 and the external connection terminals 120. A thickness of the adhesive layer 132 is from about 20 μm to about 150 μm, or is less than about 20 μm.

According to an exemplary embodiment, the adhesive layer 132 includes a heat resistant and pressure resistant material. For example, the adhesive layer 132 contains silicon (Si). The adhesive layer 132 does not transform at temperatures greater than 350° C. The adhesive layer 132 is attached to the external connection terminals 120 to cover the external connection terminals 120 and prevents the external connection terminals 120 from being separated or the conductive pads 114 from being exposed. The adhesive layer 132 can prevent the external connection terminals 120 from being transformed by pressure while the encapsulant 150 is formed.

According to an exemplary embodiment, the protective film 134 is formed on a bottom surface of the adhesive layer 132. The protective film 134 is also heat resistant and pressure resistant. For example, the protective film 134 contains polyimide. A thickness of the protective film 134 is from about 25 μm to about 50 μm or is less than about 25 μm.

According to an exemplary embodiment, the protective film 134 can prevent foreign substances from attaching to the bottom surface of the substrate main body 110 during the package process. A thermal contraction rate of the protective film 134 can be controlled by adjusting the proportion of polyimide contained therein. The protective member 130 can be adjusted to transform either upwardly convex or upwardly concave at high temperatures by controlling a thermal contraction rate between different types of layers, i.e., the adhesive layer 132 and the protective film 134. The protective member 130 can be adjusted to bend in a direction opposite to that in which the substrate main body 110 bends to prevent warping of the printed circuit board 100. For example, when the substrate main body 110 expands to be downwardly convex, the protective member 130 can contract to be upwardly convex. When the substrate main body 110 contracts to be upwardly convex, the protective member 130 can expand to be downwardly convex.

Figure 2:
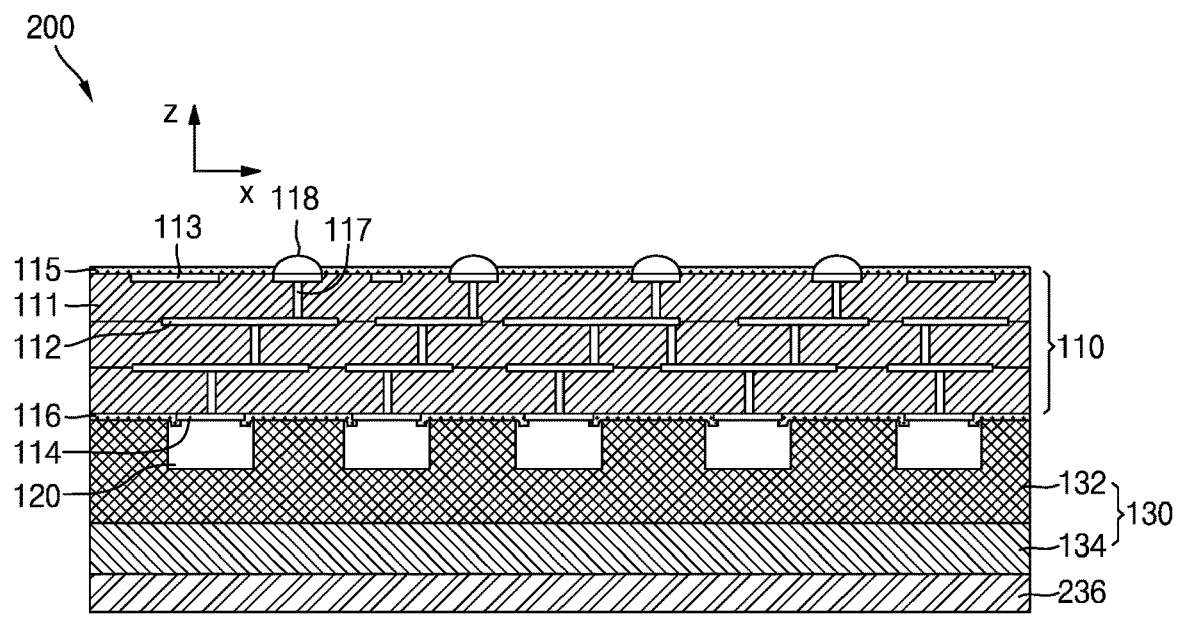
FIG. 2 is a cross-sectional view of a printed circuit board according to another exemplary embodiment of the present inventive concept.
Figure 3:
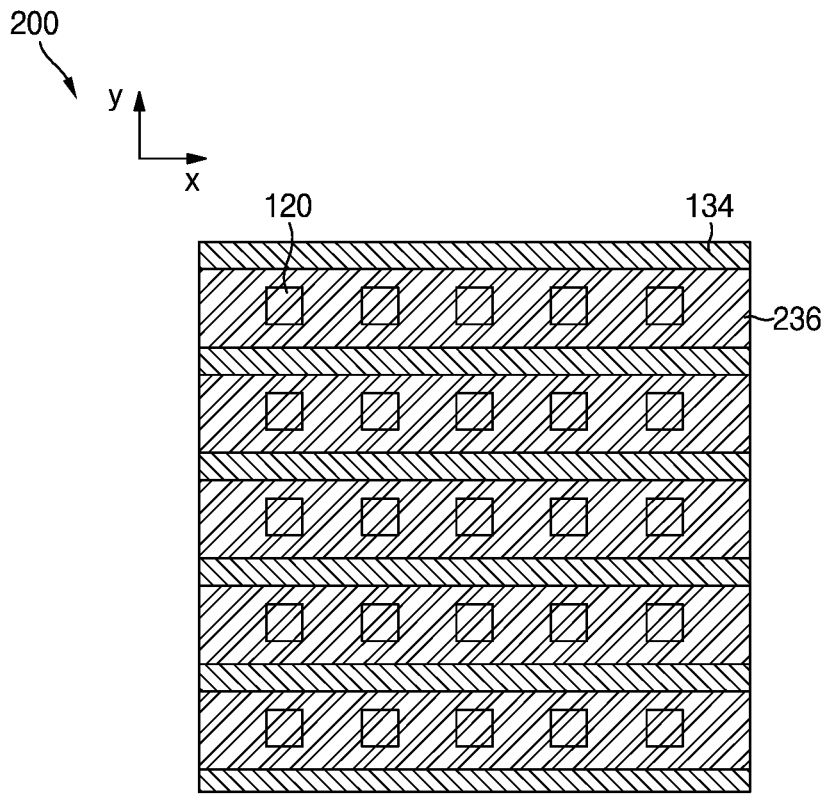
FIG. 3 is a bottom plan view of the printed circuit board of FIG. 2.
Figure 4:
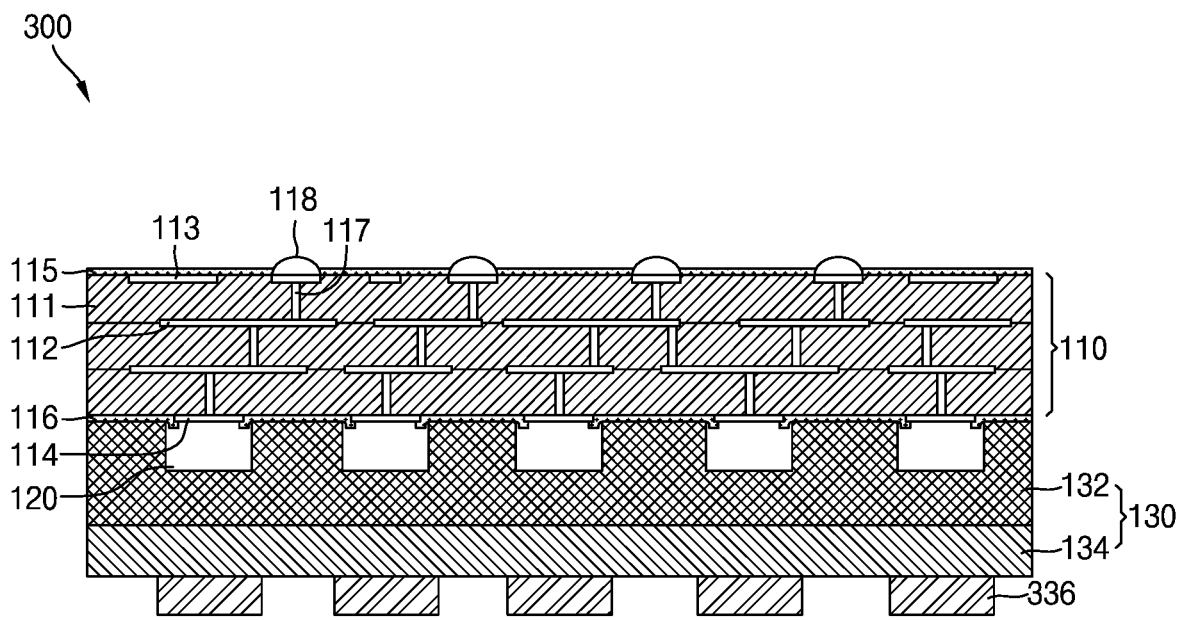
FIG. 4 is a cross-sectional view of a printed circuit board according to another exemplary embodiment of the present inventive concept.
Figure 5:
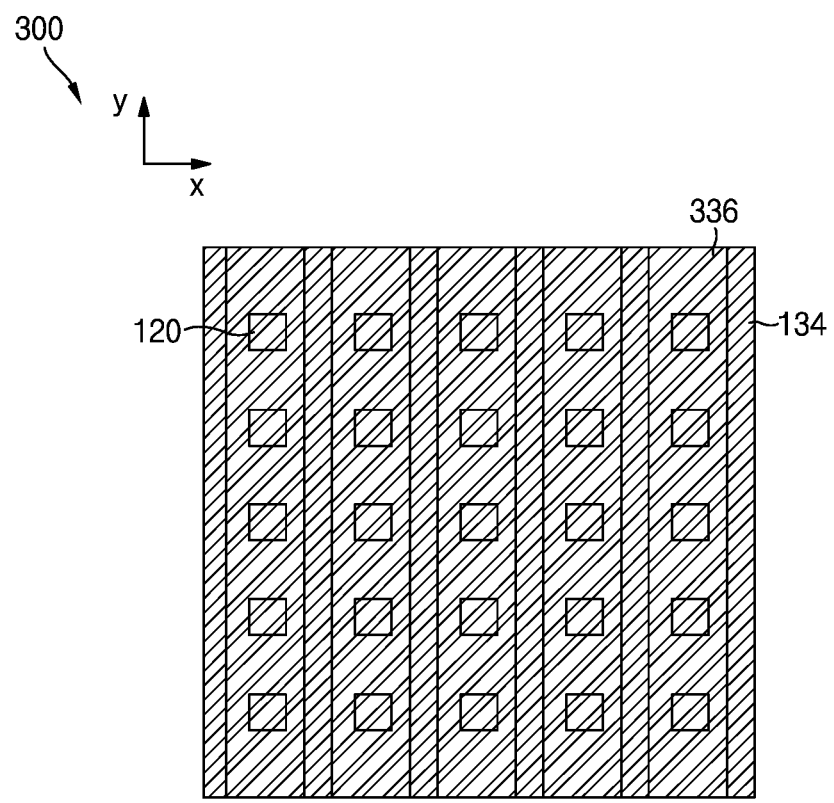
FIG. 5 is a bottom plan view of the printed circuit board of FIG. 4.

FIG. 2 is a cross-sectional view in a Z-X axes plane of a printed circuit board 200 according to an exemplary embodiment of the present inventive concept. FIG. 3 is a bottom plan view of the printed circuit board 200 of FIG. 2. FIG. 4 is a cross-sectional view in a Z-X axes plane of a printed circuit board 300 according to another exemplary embodiment of the present inventive concept. FIG. 5 is a bottom plan view of the printed circuit board 300 of FIG. 4.

Referring to FIGS. 2 and 3, according to an exemplary embodiment, an auxiliary film 236 is formed on a bottom surface of a protective film 134. The auxiliary film 236 is heat resistant and pressure resistant, and thermally expands or contracts at high temperatures. The auxiliary film 236 contains polyimide. At least two auxiliary films 236 can be attached to the bottom surface of the protective film 134. The auxiliary films 236 extend in the X-axis direction. The auxiliary films 236 may have a bar shape, but embodiments are not limited thereto.

According to an exemplary embodiment, when a substrate main body 110 contracts or expands in the X-axis direction, the substrate main body 110 warps such that a cross section thereof in the Z-X-axes plane is concavely or convexly curved. The auxiliary film 236 that extends in the X-axis direction can a control the contraction or expansion of the substrate main body 110 in the X-axis direction, thereby preventing the printed circuit board 200 from warping. For example, when the printed circuit board 200 expands or contracts in the X-axis direction, the auxiliary film 236 can be adjusted to expand or contract in an opposite X-axis direction. The auxiliary film 236 is located below the external connection terminals 120 to prevent damage to the external connection terminals 120.

Referring to FIGS. 4 and 5, according to an exemplary embodiment, at least two auxiliary films 336 are attached to the bottom surface of a protective film 134. The auxiliary films 336 have a bar shape that extends in a Y-axis direction.

According to an exemplary embodiment, when the substrate main body 110 contracts or expands in the Y-axis direction, the substrate main body 110 warps such that a cross section thereof in the X-Y-axes plane is concavely or convexly curved. The auxiliary films 336 that extend in the Y-axis direction can control the contraction or expansion of the substrate main body 110 in the Y-axis direction, thereby preventing the printed circuit board 300 from warping.

Figure 6:
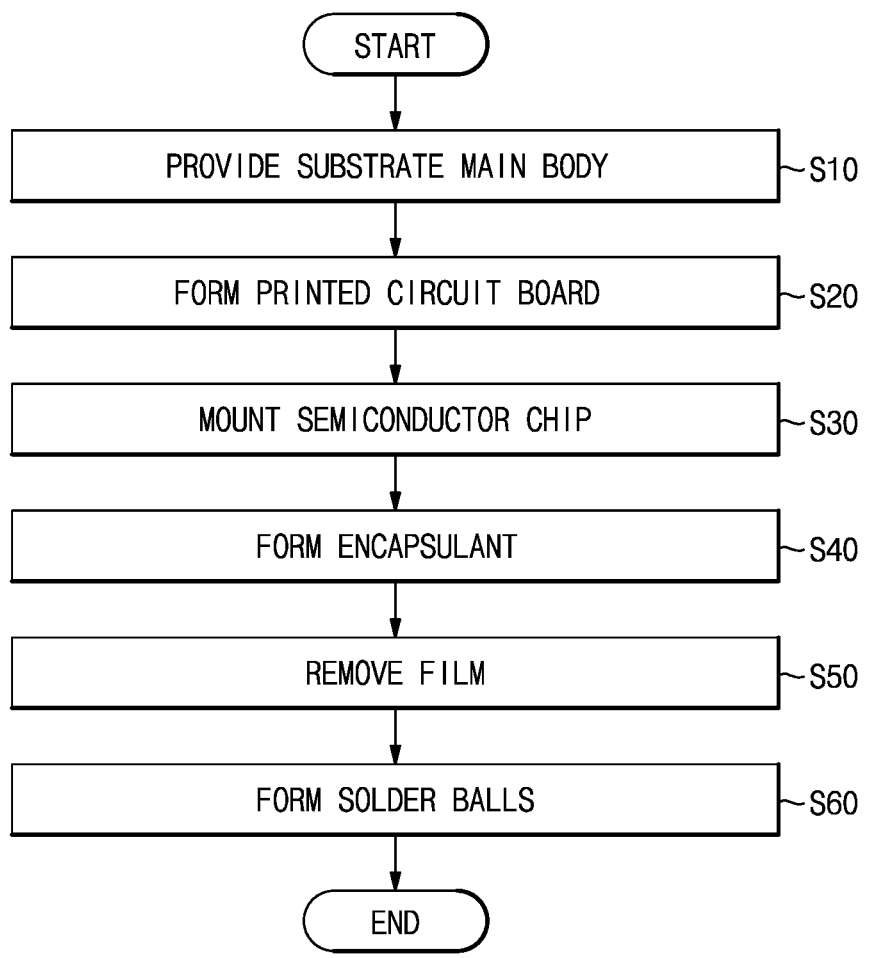
FIG. 6 is a flowchart of a method of manufacturing a semiconductor package according to an exemplary embodiment of the present inventive concept.

FIG. 6 is a flowchart of a method of manufacturing a semiconductor package according to an exemplary embodiment of the present inventive concept.

Referring to FIG. 6, a method of manufacturing a semiconductor package includes preparing a substrate main body (operation S10), forming a printed circuit board (operation S20), mounting a semiconductor chip (operation S30), forming an encapsulant (operation S40), removing a film (operation S50), and forming solder balls (operation S60).

According to an exemplary embodiment, in preparing the substrate main body (operation S10), the substrate main body 110 is prepared that has the external connection terminals 120 attached to a bottom surface thereof. The substrate main body 110 is formed by alternately stacking the insulating layers 111 and the conductive layers 112. In forming the printed circuit board (operation S20), the printed circuit board 100 is formed by attaching the protective member 130 to the bottom surface of the substrate main body 110 to cover the external connection terminals 120. The protective member 130 includes the adhesive layer 132 and the protective film 134. In mounting the semiconductor chip (operation S30), a semiconductor chip 140 (see. FIGS. 9A and 10-12) is attached to the printed circuit board 100. The semiconductor chip 140 is mounted using the solder bumps 118 formed on a top surface of the substrate main body 110. In forming the encapsulant (operation S40), the encapsulant 150 is formed to cover upper portions of the semiconductor chip 140 and the printed circuit board 100, in removing the film (operation S50), the protective member 130 attached to the printed circuit board 100 is removed. In forming the solder balls (operation S60), solder balls are formed by processing the external connection terminals 120. The external connection terminals 120 are processed via a reflow process.

In addition, according to an exemplary embodiment, a method of manufacturing a semiconductor package further includes performing a curing process to cool the encapsulant 150 after forming the encapsulant (operation S40), and performing a coining process to equalize heights of solder balls 122 after forming the solder balls (operation S60).

FIGS. 7 to 12 are cross-sectional views that sequentially illustrate a method of manufacturing a printed circuit board according to an exemplary embodiment of the present inventive concept. Descriptions of parts of FIGS. 7 to 12 identical to those of FIGS. 1 to 5 are omitted here.

Figure 7:
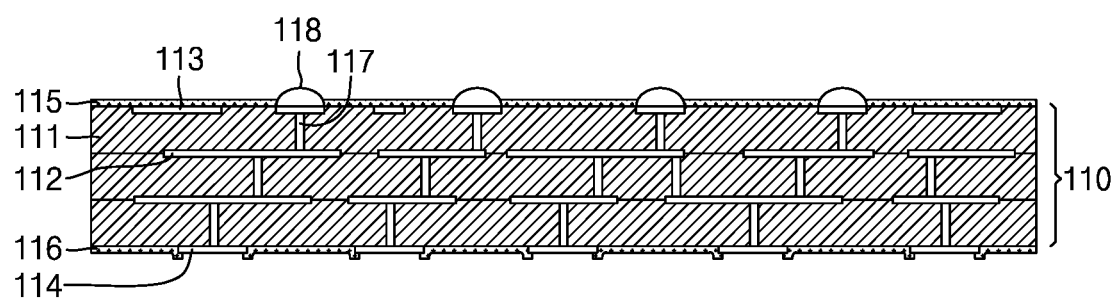
FIGS. 7 to 12 are cross-sectional views that sequentially illustrate a method of manufacturing a printed circuit board according to an exemplary embodiment of the present inventive concept.

Referring to FIG. 7, according to an exemplary embodiment, the substrate main body 110 is prepared in which the insulating layers 111 and the conductive layers 112 are alternately stacked such that the conductive layers 112 form a circuit pattern and the conductive pads 113 and 114 are attached to top and bottom surfaces of the stacked insulating layers 111. The top-surface solder mask 115 and the bottom-surface solder mask 116 are respectively formed on top and bottom surfaces of the substrate main body 110. The solder bumps 118 may be formed on the conductive pads 113, but may be omitted.

According to an exemplary embodiment, the insulating layers 111 are formed of at least one material selected from a phenol resin, an epoxy resin, or polyimide. For example, the insulating layers 111 contain at least one material selected from the group consisting essentially of frame retardant 4 (FR4), a polyphenylene ether, a tetra-functional epoxy, thermount, a cyanate ester, or polyimide. Alternatively, the insulating layers 111 may contain a prepreg.

According to an exemplary embodiment, the conductive layers 112 form a circuit pattern. The conductive layers 112 are formed by processing a conductive plate via mechanical drilling, plasma etching, laser drilling, etc.

According to an exemplary embodiment, the substrate main body 110 is a coreless substrate, e.g., an ETS. The conductive pads 113 are embedded in the insulating layer 111 such that top surfaces of conductive pads 113 and a top surface of the insulating layer 111 are at the same level.

According to an exemplary embodiment, the top-surface solder mask 115 and the bottom-surface solder mask 116 are formed by photo solder resist printing. For example, a photo solder resist is patterned, exposed, developed, and dried. The top-surface solder mask 115 and the bottom-surface solder mask 116 are partially etched to expose the conductive pads 113 and 114.

According to an exemplary embodiment, the conductive vias 117 are formed in the insulating layers 111. The conductive vias 117 are formed by forming via holes in the insulating layers 111 and filling the via holes with a conductive material. The solder bumps 118 are formed on the exposed conductive pads 113, and a seed layer is formed below the solder bumps 118. The solder bumps 118 include copper pillars.

Figure 8:
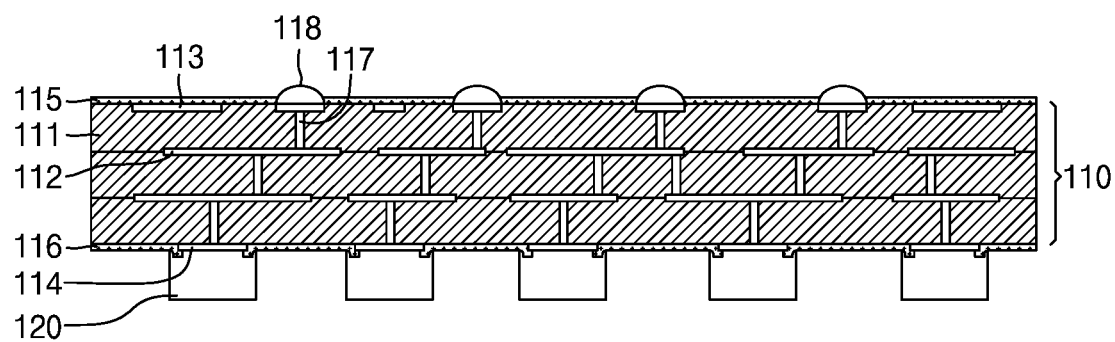

Referring to FIG. 8, according to an exemplary embodiment, the external connection terminals 120 are formed on the bottom surface of the substrate main body 110. The external connection terminals 120 are formed on bottom surfaces of the conductive pads 114. A photoresist pattern is formed by forming a photoresist film on the bottom surface of the substrate main body 110 and exposing and developing the photoresist film. The external connection terminals 120 are formed by filling the photoresist pattern with a metal via electroplating after the photoresist pattern is formed. The external connection terminals 120 include tin (Sn), lead (Pb), silver (Ag), or bismuth (Bi).

Figure 9A:
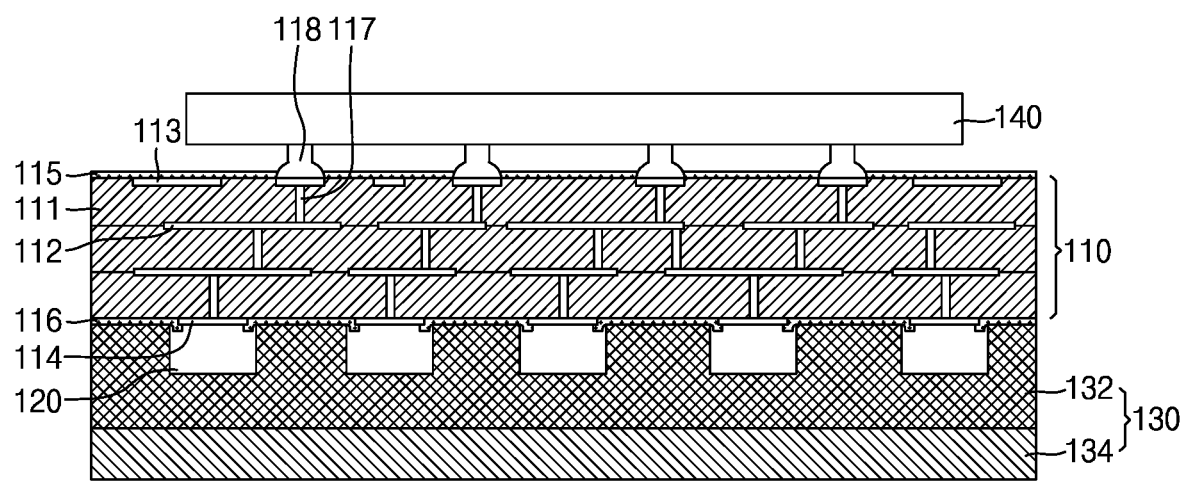

Referring to FIGS. 1 and 9A, according to an exemplary embodiment, the protective member 130 is formed on the bottom surface of the substrate main body 110, and the semiconductor chip 140 is mounted on the substrate main body 110. The protective member 130 is formed to cover the external connection terminals 120 and the bottom-surface solder mask 116. The protective member 130 has a heterojunction structure in which different layers are stacked. The protective member 130 includes the adhesive layer 132 and the protective film 134. The adhesive layer 132 is formed on the bottom surface of the substrate main body 110. The protective film 134 is formed on a bottom surface of the adhesive layer 132. The adhesive layer 132 and the protective film 134 are heat resistant and pressure resistant and either thermally contract or thermally expand. The adhesive layer 132 contains silicon. The protective film 134 contains polyimide.

According to an exemplary embodiment, the semiconductor chip 140 is mounted on the top surface of the substrate main body 110 after the protective member 130 is formed. The semiconductor chip 140 may be mounted by wire bonding or flip-chip bonding. In a flip-chip bonding method, the semiconductor chip 140 is positioned such that bumps formed on a bottom surface of the semiconductor chip 140 and the solder bumps 118 are in contact with each other.

Figure 9B:
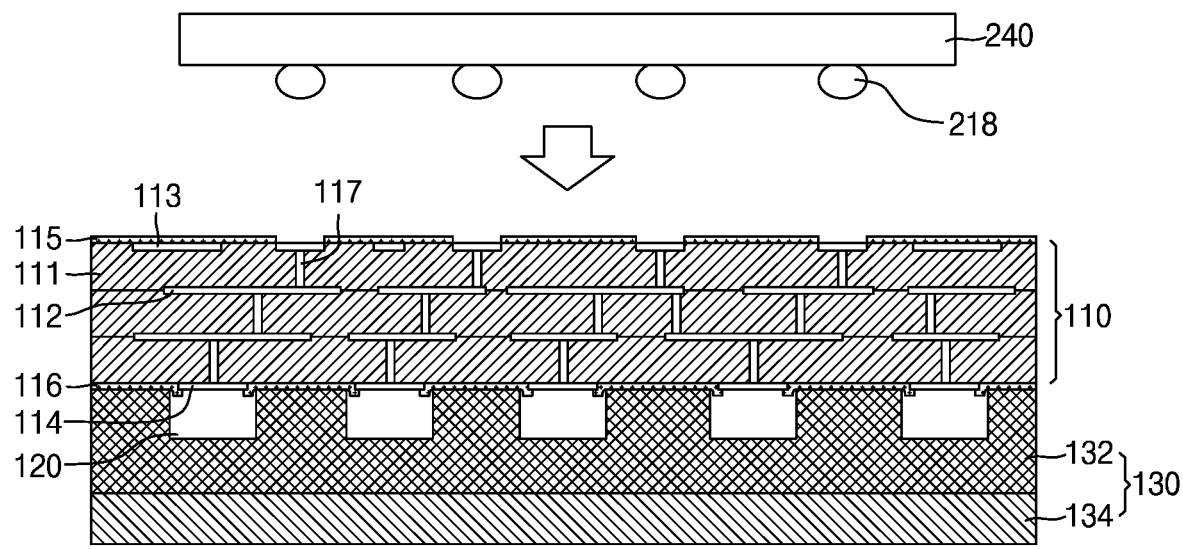

Referring to FIG. 9B, according to an exemplary embodiment, a semiconductor chip 240 is mounted on the substrate main body 110 on which no solder bumps are formed. Solder bumps 218 are formed on a bottom surface of the semiconductor chip 240. The solder bumps 218 are attached to the conductive pads 113 on the top surface of the substrate main body 110.

Figure 9C:
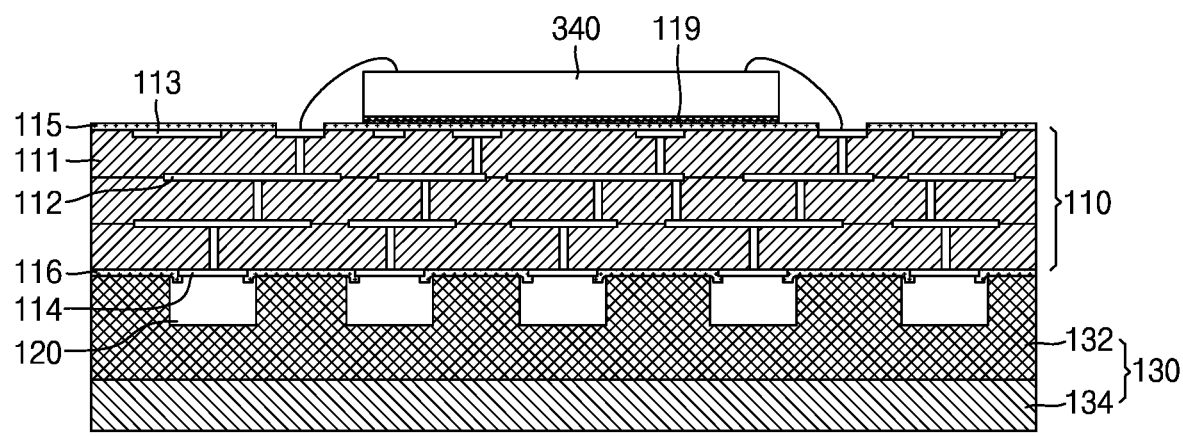

Referring to FIG. 9C, according to an exemplary embodiment, a semiconductor chip 340 is mounted on the substrate main body 110 by wire bonding. The semiconductor chip 340 is attached to the top surface of the substrate main body 110 via an adhesive tape 119. The adhesive tape 119 is formed on the top-surface solder mask 115. The semiconductor chip 340 and the substrate main body 110 are electrically connected by a wire.

Figure 10:
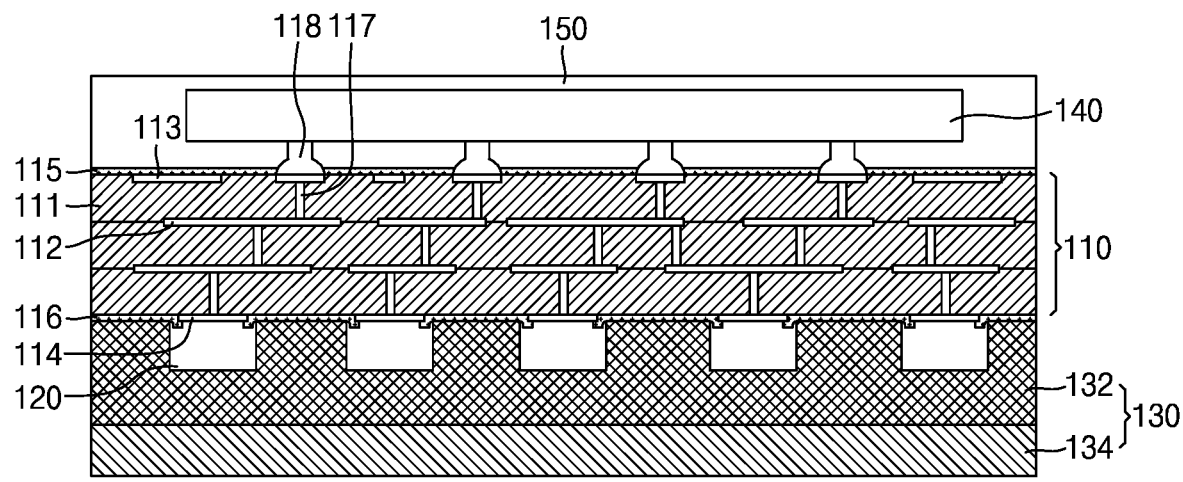

Referring to FIG. 10, according to an exemplary embodiment, the encapsulant 150 is formed to cover the semiconductor chip 140 and the printed circuit board 100. The encapsulant 150 is a resin containing epoxy or polyimide. For example, the encapsulant 150 may be a bisphenol-group epoxy resin, a polycyclic aromatic epoxy resin, an o-cresol novolac epoxy resin, a biphenyl-group epoxy resin, a naphthalene-group epoxy resin, etc.

According to an exemplary embodiment, the encapsulant 150 is formed by injecting a molding resin into the semiconductor chip 140 using, e.g., a nozzle and applying pressure to the semiconductor chip 140 using, e.g., a press. The amount of molding resin, the temperature at which the pressure is applied, the time period during which the pressure is applied, and the pressure are set based on the physical properties of the molding resin. The encapsulant 150 protects the printed circuit board 100 and the semiconductor chip 140 from the external environment.

According to an exemplary embodiment, the protective member 130 prevents the substrate main body 110 from being crushed or bent during an encapsulant forming process. Furthermore, the protective member 130 protects the substrate main body 110 from being partially torn or cut. The protective member 130 prevents the substrate main body 110 from sagging and from being separated from a magazine during a package process.

In addition, according to embodiments, a space between the semiconductor chip 140 and the printed circuit board 100 is filled with an underfill material. The underfill material includes an epoxy resin. In a method of manufacturing a semiconductor package, the step of forming the encapsulant (operation S40) can be skipped and only a process of filling the underfill material is performed. After forming the encapsulant (operation S40), a curing process is performed at a predetermined temperature. The encapsulant 150 is hardened by the curing process. The molding resin contains carbon black as a coloring agent, and may further contain a hardener, a filler, a flame retarding material, etc. After the curing process, a marking process is performed to mark a package identification number.

Figure 11:
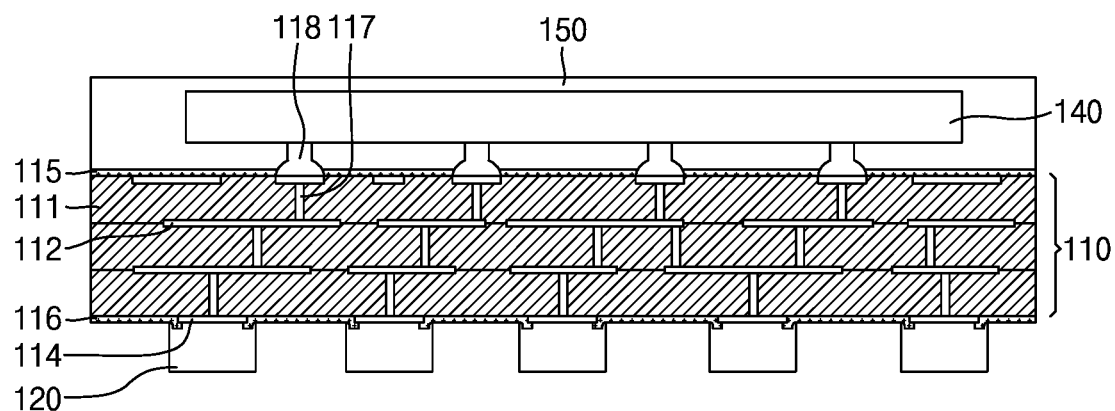
Figure 12:
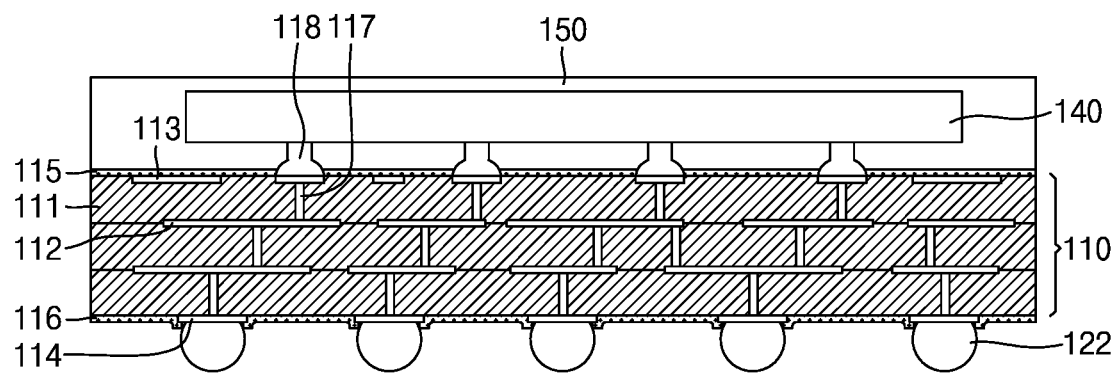

Referring to FIGS. 11 and 12, according to an exemplary embodiment, the protective member 130 is removed from the bottom surface of the substrate main body 110. The protective member 130 is removed using a tape whose adhesive strength is stronger than that of the adhesive layer 132. After the protective member 130 is removed, the external connection terminals 120 and the bottom-surface solder mask 116 are externally exposed while being attached to the bottom surface of the substrate main body 110.

According to an exemplary embodiment, solder balls 122 are formed by processing the external connection terminals 120. For example, the solder balls 122 can be formed via a reflow process. The printed circuit board 100 is mounted on a reflow device and transferred along a transfer rail. As the printed circuit board 100 is transferred, the printed circuit board 100 is heated and the solder balls 122 are formed from the external connection terminals 120. The solder balls 122 each have a spherical shape due to surface tension of the heated external connection terminals 120.

According to an exemplary embodiment, during the package process, the solder balls 122 may return to their original state due to the reflow process even when the external connection terminals 120 are damaged or transformed.

After the solder balls 122 are formed, according to an exemplary embodiment, a coining process is performed. Since the solder balls 122 are pressurized by the coining process, heights of the solder balls 122 are equalized, which decreases a disappearance rate of the solder balls 122. Due to the coining process, the printed circuit board 100 is pressurized to be prevented from warping.

According to exemplary embodiments of the present inventive concept, before a semiconductor chip is mounted, a protective member is attached to a bottom surface of a substrate main body to prevent damage to a printed circuit board, prevent the bottom surface of the printed circuit board from being polluted by foreign substances, and prevent the substrate from being damaged due to the pollution of the bottom surface of the printed circuit board. According to exemplary embodiments of the present inventive concept, the stiffness of the printed circuit board is reinforced by increasing the thickness of the printed circuit board with the protective member during a package process. The protective member includes different types of layers, i.e., an adhesive layer and a protective film, to control warping of the printed circuit board.

According to exemplary embodiments of the present inventive concept, the protective member attached to the bottom surface of the printed circuit board prior to the package process that covers external connection terminals is removed after a molding process, and solder balls are formed by a reflow process to prevent disappearance of the solder balls.

According to exemplary embodiments of the present inventive concept, a semiconductor wafer that successfully passes a semiconductor pre-process is prevented from being defective in a semiconductor post-process that includes testing and packaging, thereby improving a yield of a semiconductor process and decreasing productivity costs.

While exemplary embodiments of the present inventive concept have been described with reference to the accompanying drawings, it should be understood by those skilled in the art that various modifications can be made without departing from the scope of the exemplary embodiments of the present inventive concept and without changing essential features thereof. Therefore, the above-described exemplary embodiments should be considered in a descriptive sense only and not for purposes of limitation.

What is claimed is:

1. A method of manufacturing a semiconductor package, the method comprising:
   providing a substrate main body to which external connection terminals are attached;
   attaching a protective member to the substrate main body to cover the external connection terminals;
   mounting a semiconductor chip on a surface of the substrate main body that is opposite from the protective member;
   removing the protective member from the substrate main body, wherein side surfaces and a bottom surface of the external connection terminals are exposed; and
   forming solder balls by processing the exposed external connection terminals, after removing the protective member.

2. The method of claim 1, wherein the protective member is heat resistant and pressure resistant.

3. The method of claim 1, wherein the protective member transforms in a direction opposite to a direction in which the substrate main body transforms.

4. The method of claim 3, wherein the protective member comprises an adhesive layer and a protective film,
   wherein a top surface of the adhesive layer is in contact with a first surface of the substrate main body, and
   a top surface of the protective film is in contact with a bottom surface of the adhesive layer.

5. The method of claim 4, wherein
   the adhesive layer comprises silicon, and
   the protective film comprises polyimide.

6. The method of claim 5, wherein the adhesive layer and the protective film have different thermal contraction or expansion rates.

7. The method of claim 1, further comprising forming an encapsulant that covers a second surface of the substrate main body and the semiconductor chip.

8. The method of claim 1, further comprising:
   attaching an auxiliary film to a bottom surface of the protective member, wherein the auxiliary film extends along one direction of the substrate main body and transforms in a direction opposite to a direction in which the substrate main body transforms; and
   removing the auxiliary film from the substrate main body.

9. A method of manufacturing a semiconductor package, the method comprising:
   providing a substrate main body to which external connection terminals are attached, wherein the substrate main body includes insulating layers and conductive layers that are alternately stacked, conductive pads attached to top and bottom surfaces of the stacked insulating layers, and conductive vias that electrically connect the conductive pads on different adjacent layers;
   attaching a protective member to a first surface of the substrate main body, wherein the protective member contains an amount of polyimide adjusted to control warping, of the substrate main body;
   mounting a semiconductor chip on a second surface of the substrate main body opposite from the first surface;

forming an encapsulant that covers the second, surface of the substrate main body and the semiconductor chip;

removing the protective member from the substrate main body, wherein side surfaces and a bottom surface of the external connection terminals are exposed, and forming solder balls from the exposed external connection terminals by heating the exposed external connection terminals, after removing the protective member.

10. The method of claim 9, wherein the protective member transforms in a direction opposite to a direction in which the substrate main body transforms.

11. The method of claim 9, wherein the protective member covers the external connection terminals.

12. The method of claim 9, wherein the protective member comprises an adhesive layer and a protective film,
wherein a top surface of the adhesive layer is in contact with a first surface of the substrate main body, and
a top surface of the protective film is in contact with a bottom surface of the adhesive layer.

13. The method of claim 12, wherein
the adhesive layer comprises silicon, and
the protective film comprises the polyimide.

* * * * *